(12) United States Patent
Shimura et al.

(10) Patent No.: US 10,393,524 B2
(45) Date of Patent: Aug. 27, 2019

(54) ELECTRONIC DEVICE, ELECTRONIC APPARATUS, AND MOVING OBJECT

(71) Applicant: Seiko Epson Corporation, Tokyo (JP)

(72) Inventors: Masashi Shimura, Suwa (JP); Takashi Nomiya, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 384 days.

(21) Appl. No.: 14/886,630

(22) Filed: Oct. 19, 2015

(65) Prior Publication Data

US 2016/0116284 A1 Apr. 28, 2016

(30) Foreign Application Priority Data

Oct. 28, 2014 (JP) ................................. 2014-219773

(51) Int. Cl.
 *G01C 19/5628* (2012.01)
(52) U.S. Cl.
 CPC ..... *G01C 19/5628* (2013.01); *H01L 2224/48091* (2013.01); *H01L 2224/73265* (2013.01); *H01L 2924/16195* (2013.01)
(58) Field of Classification Search
 CPC ........ G01C 19/00; G01C 19/04; G01C 19/56; G01C 19/5642; G01C 19/5649; G01C 19/5705; G01C 19/5712; G01C 19/5776
 See application file for complete search history.

(56) References Cited

U.S. PATENT DOCUMENTS

| 6,391,742 | B2 * | 5/2002 | Kawai | B81B 7/007 257/678 |
|---|---|---|---|---|
| 7,045,868 | B2 * | 5/2006 | Ding | B81B 7/007 257/414 |
| 7,088,032 | B2 * | 8/2006 | Oita | H03B 5/32 219/210 |
| 8,049,326 | B2 * | 11/2011 | Najafi | B81B 7/0058 257/678 |
| 8,821,009 | B2 * | 9/2014 | Abdelmoneum | G01K 7/32 331/154 |
| 9,123,883 | B2 * | 9/2015 | Kurita | H01L 41/0533 |
| 9,187,310 | B2 * | 11/2015 | Ziglioli | B81B 3/0021 |
| 9,209,383 | B2 * | 12/2015 | Osawa | H01L 41/09 |

(Continued)

FOREIGN PATENT DOCUMENTS

JP 2012-79750 A 4/2012
JP 2012-079751 A 4/2012
(Continued)

*Primary Examiner* — Paul M. West
*Assistant Examiner* — Mark A Shabman
(74) *Attorney, Agent, or Firm* — Oliff PLC

(57) ABSTRACT

An electronic device includes an vibration element including an vibration body provided with an adjustment section, an electrode disposed on the vibration body, and a connection electrode electrically connected to the electrode, an IC so disposed that the IC faces the vibration element, terminals disposed on the side facing the upper surface of the IC and electrically connected to the connection electrode via a fixing member, wiring sections electrically connected to the terminals and located below the terminals, and a protective layer located above the wiring sections and disposed in a portion where the adjustment section overlaps with the wiring sections in a plan view.

21 Claims, 16 Drawing Sheets

(56) References Cited

U.S. PATENT DOCUMENTS

| | | | |
|---|---|---|---|
| 9,365,415 B2* | 6/2016 | Luan | B81B 7/007 |
| 9,490,773 B2* | 11/2016 | Nakagawa | H03H 9/21 |
| 9,568,312 B2* | 2/2017 | Shibata | G01C 19/56 |
| 9,568,313 B2* | 2/2017 | Nishizawa | G01C 19/5628 |
| 2004/0071337 A1* | 4/2004 | Jeung | A61B 5/08 |
| | | | 382/151 |
| 2008/0257044 A1* | 10/2008 | Watanabe | G01C 19/5663 |
| | | | 73/504.15 |
| 2009/0085191 A1* | 4/2009 | Najafi | B81B 7/0058 |
| | | | 257/698 |
| 2012/0079882 A1 | 4/2012 | Chiba et al. | |
| 2012/0126664 A1* | 5/2012 | Ogura | G01C 19/5607 |
| | | | 310/312 |
| 2013/0320812 A1* | 12/2013 | Yamaguchi | H01L 41/053 |
| | | | 310/348 |
| 2014/0103467 A1 | 4/2014 | Chiba et al. | |
| 2014/0142435 A1* | 5/2014 | Bernal | A61B 5/091 |
| | | | 600/476 |
| 2015/0078112 A1* | 3/2015 | Huang | G11C 11/40618 |
| | | | 365/222 |
| 2015/0105670 A1* | 4/2015 | Bresch | A61B 5/0077 |
| | | | 600/479 |
| 2015/0162522 A1* | 6/2015 | Ogura | G01C 19/5621 |
| | | | 310/348 |
| 2015/0268107 A1* | 9/2015 | Nishizawa | G01L 1/162 |
| | | | 310/321 |
| 2015/0276404 A1* | 10/2015 | Nishizawa | G01C 19/5642 |
| | | | 73/504.12 |
| 2016/0116286 A1* | 4/2016 | Nishizawa | G01C 19/5628 |
| | | | 257/415 |
| 2017/0059393 A1* | 3/2017 | Nishizawa | G01C 19/5621 |

FOREIGN PATENT DOCUMENTS

| | | |
|---|---|---|
| JP | 2012-168077 A | 9/2012 |
| JP | 2012-172970 A | 9/2012 |

* cited by examiner

ELECTRONIC DEVICE, ELECTRONIC APPARATUS, AND MOVING OBJECT

BACKGROUND

1. Technical Field

The present invention relates to an electronic device, an electronic apparatus, and a moving object.

2. Related Art

As an electronic device for detecting angular velocity, there is a known electronic device of related art, such as that described in JP-A-2012-168077. The electronic device described in JP-A-2012-168077 includes a semiconductor device (IC), an vibration element disposed on the semiconductor device, and a stress relaxation layer interposed between the semiconductor device and the vibration element. The stress relaxation layer is provided with terminals electrically connected to the vibration element and wiring lines that electrically connect the terminals to the semiconductor device. Each of the wiring lines has a portion routed through an area inside the contour line of the vibration element in a plan view. In the configuration described above, however, the vibration element transmits laser light used when an vibration characteristic of the vibration element is adjusted and the wiring lines are undesirably irradiated with the laser light, possibly resulting in breakage or any other damage of the wiring lines. That is, the electronic device described in JP-A-2012-168077 is problematic in that an electric characteristic thereof is likely to be affected.

SUMMARY

An advantage of some aspects of the invention is to provide an electronic device, an electronic apparatus, and a moving object having an electric characteristic that is unlikely to be affected.

The invention can be implemented as the following forms or application examples.

APPLICATION EXAMPLE 1

An electronic device according to this application example includes an vibration element including an vibration body provided with an adjustment section, an electrode disposed on the vibration body, and a connection electrode electrically connected to the electrode, a semiconductor substrate so disposed that the semiconductor substrate faces the vibration element, a connection pad disposed between the semiconductor substrate and the vibration element and electrically connected to the connection electrode via a conductive connection member, a wiring line electrically connected to the connection pad and located between the connection pad and the semiconductor substrate, and a protective layer located between the wiring line and the vibration element and disposed in a portion where the adjustment section overlaps with the wiring line in a plan view.

With this configuration, an electronic device having an electrical characteristic that is unlikely to be affected can be provided.

APPLICATION EXAMPLE 2

It is preferable that the electronic device according to this application example further includes a first insulating layer disposed between the semiconductor substrate and the vibration element, and a second insulating layer disposed between the first insulating layer and the vibration element, the wiring line is disposed on the first insulating layer, and each of the connection pad and the protective layer is disposed on the second insulating layer.

With this configuration, the connection pad, the protective layer, and the wiring line can therefore be readily arranged.

APPLICATION EXAMPLE 3

In the electronic device according to this application example, it is preferable that each of the first insulating layer and the second insulating layer has elasticity.

With this configuration, the first and second insulating layers relax impact, whereby the amount of damage of the vibration element is reduced.

APPLICATION EXAMPLE 4

In the electronic device according to this application example, it is preferable that the protective layer contains a metal material.

With this configuration, the configuration of the protective layer can be simplified.

APPLICATION EXAMPLE 5

In the electronic device according to this application example, it is preferable that the vibration body has a detection vibration arm, and that the electrode has a detection signal electrode disposed on the detection vibration arm.

With this configuration, the electronic device can detect a physical quantity.

APPLICATION EXAMPLE 6

In the electronic device according to this application example, it is preferable that the vibration element is capable of detecting angular velocity.

With this configuration, the electronic device can be used as an angular velocity sensor.

APPLICATION EXAMPLE 7

An electronic apparatus according to this application example includes the electronic device according to any of the application examples described above.

With this configuration, a highly reliable electronic apparatus can be provided.

APPLICATION EXAMPLE 8

A moving object according to this application example includes the electronic device according to any of the application examples described above.

With this configuration, a highly reliable moving object can be provided.

BRIEF DESCRIPTION OF THE DRAWINGS

The invention will be described with reference to the accompanying drawings, wherein like numbers reference like elements.

FIG. 3A is a top view, and FIG. 3B is a see-through view.

DESCRIPTION OF EXEMPLARY EMBODIMENTS

An electronic device, an electronic apparatus, and a moving object according to embodiments of the invention will be described below in detail with reference to the accompanying drawings.

First Embodiment

Figure 1:
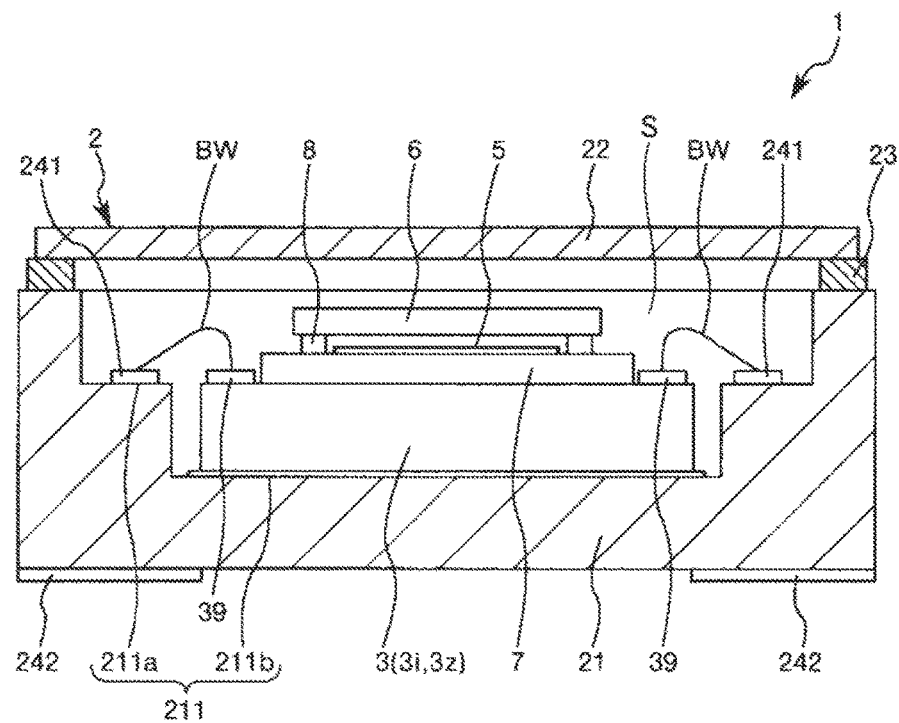
FIG. 1 is a cross-sectional view showing an electronic device according to a first embodiment of the invention.
Figure 2:
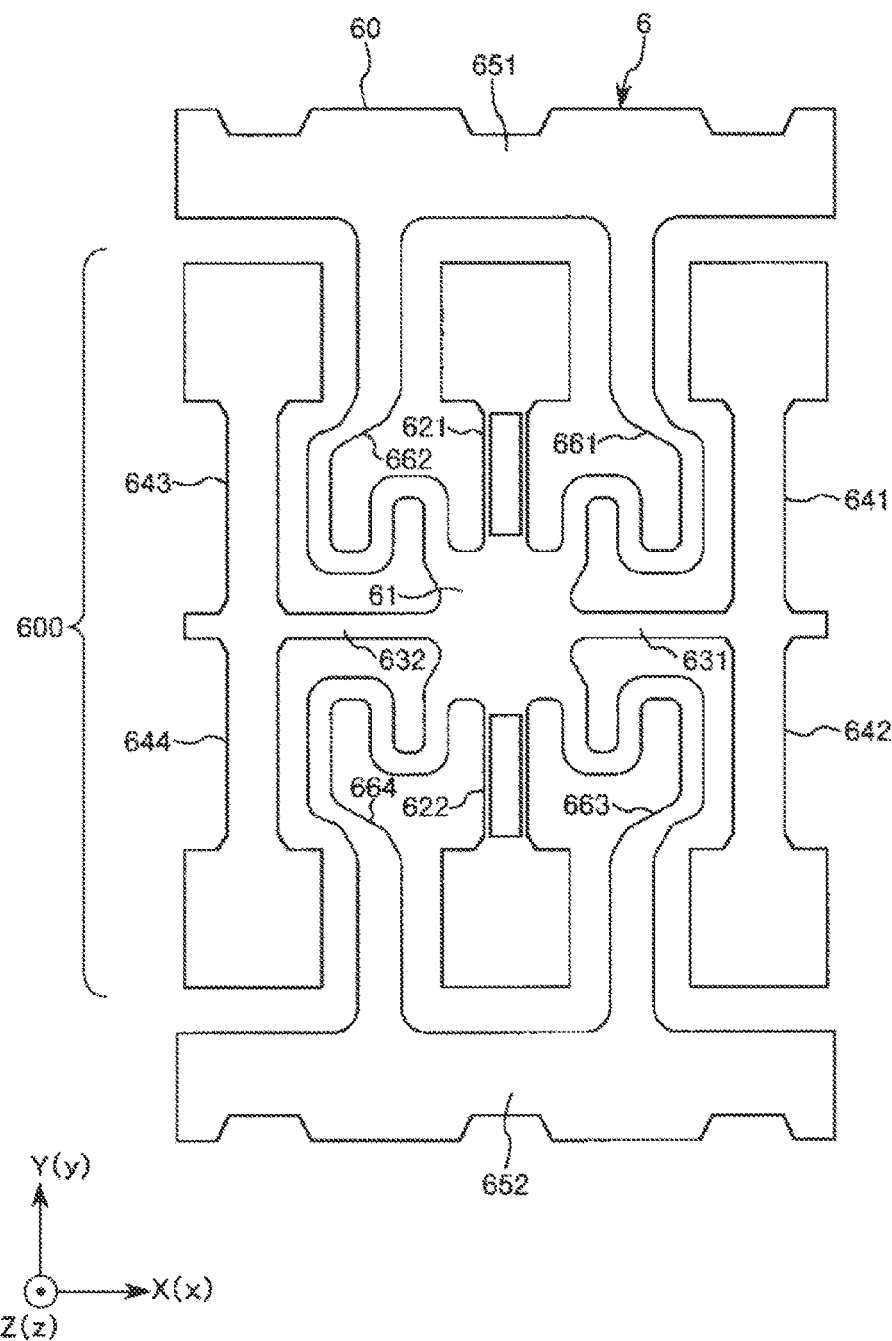
FIG. 2 is a plan view of an vibration element provided in the electronic device shown in FIG. 1.
Figure 3A:
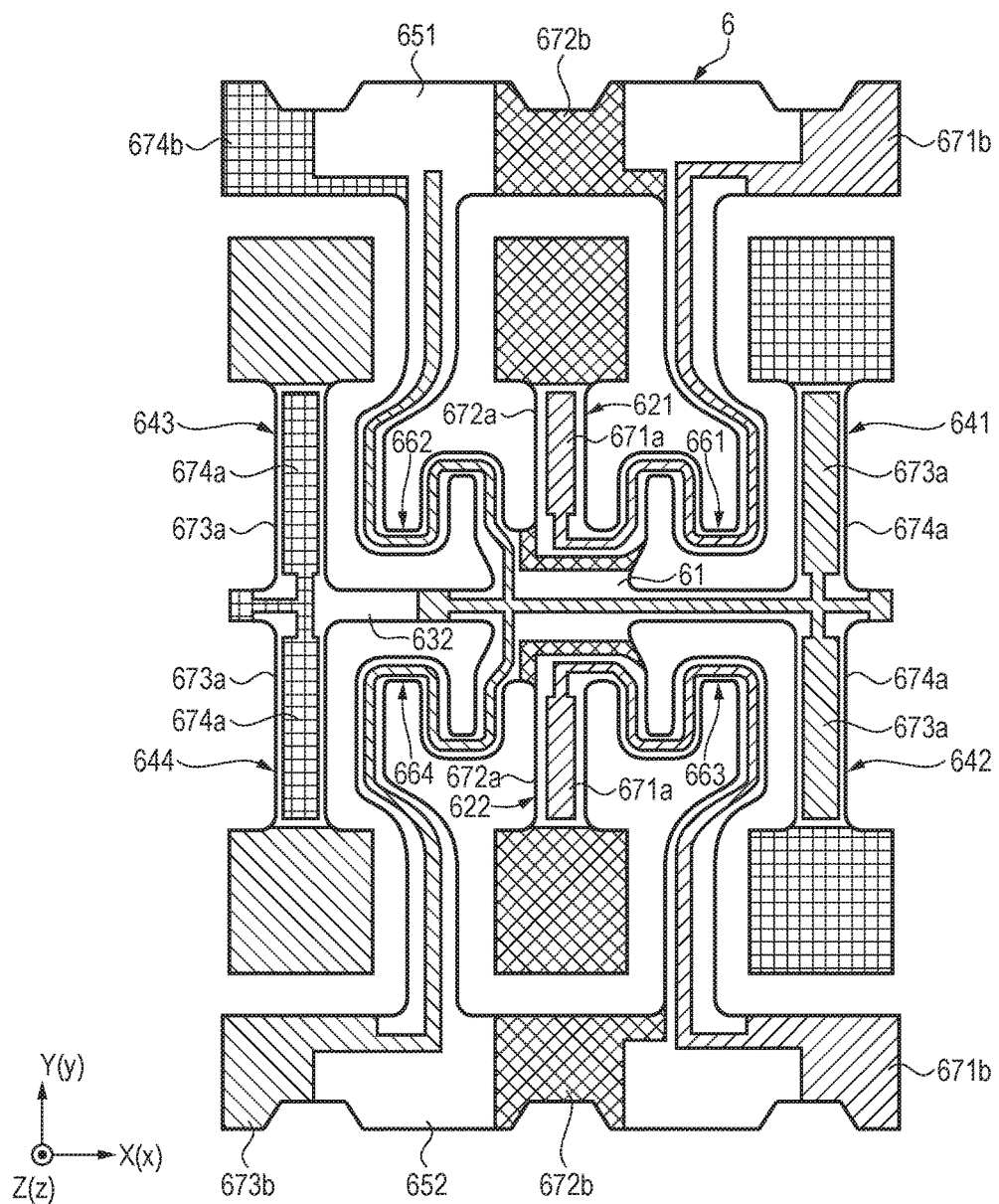
FIGS. 3A and 3B show the arrangement of electrodes on the vibration element shown in FIG. 2.
Figure 3B:
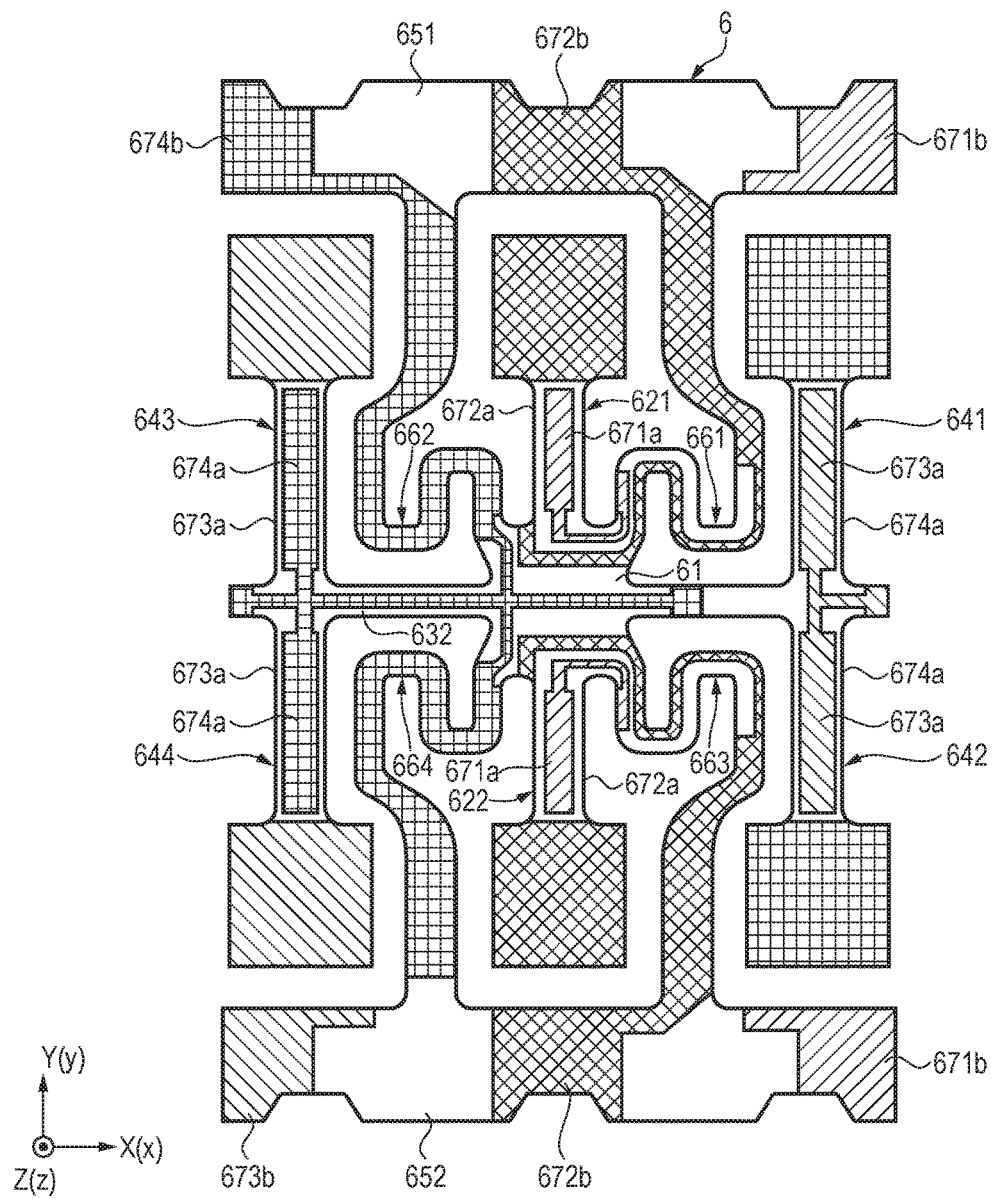
Figure 4A:
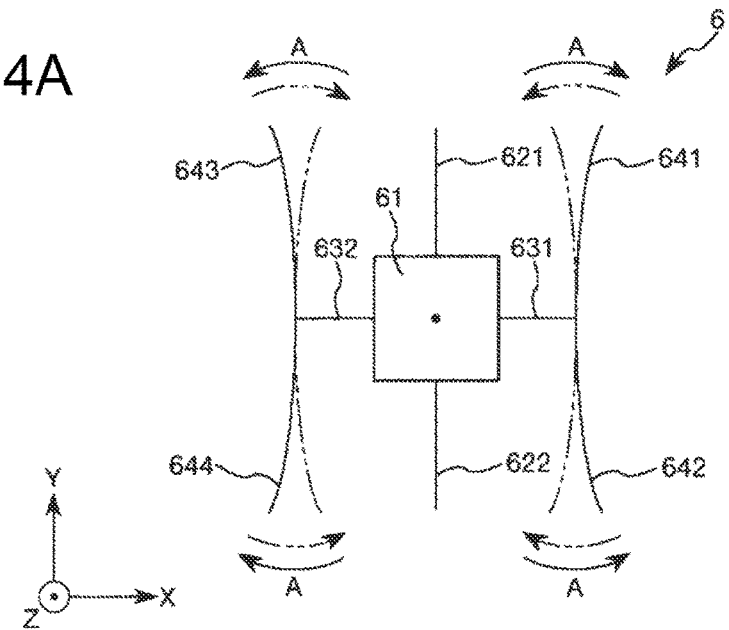
FIGS. 4A and 4B are diagrammatic views for describing the action of the vibration element shown in FIG. 2.
Figure 4B:
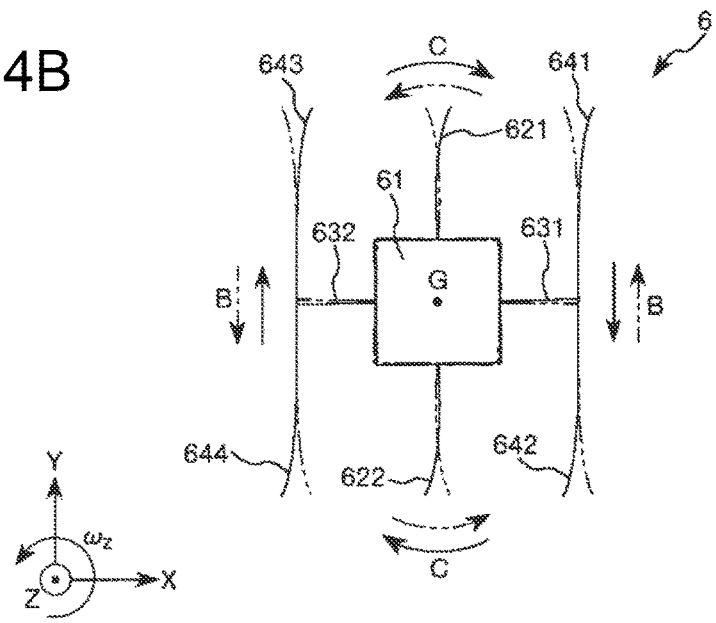
Figure 5:
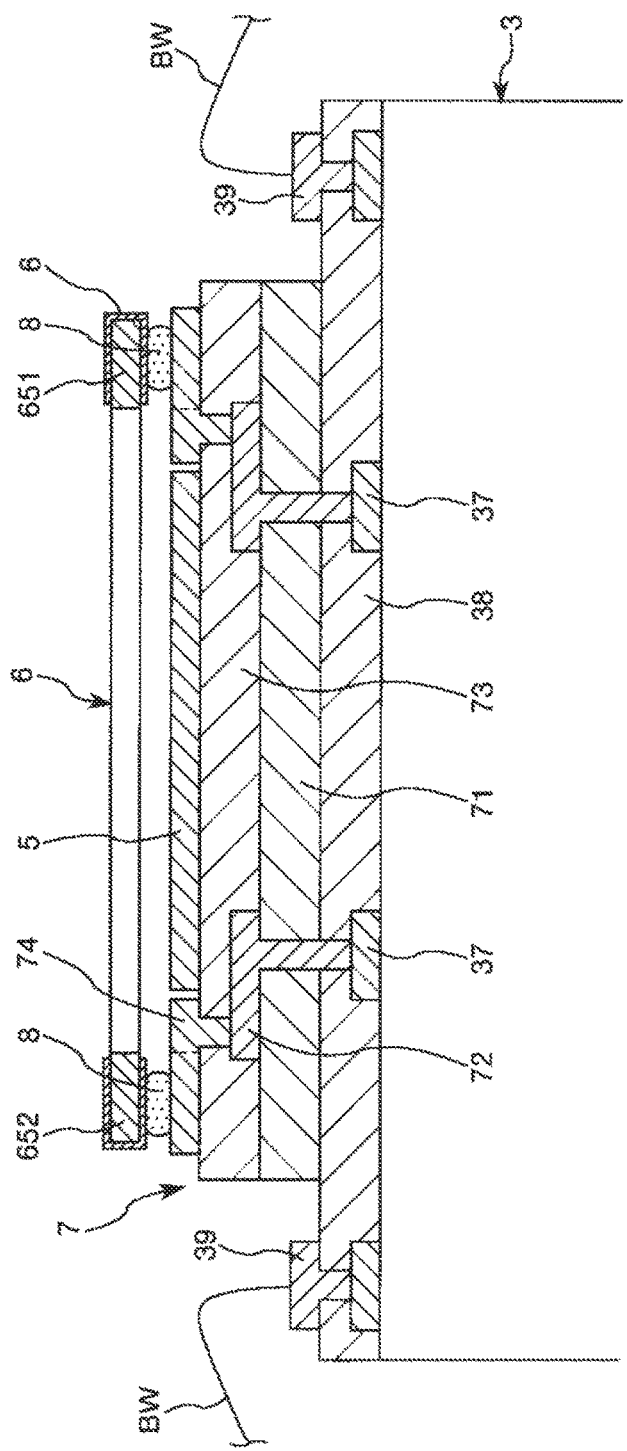
FIG. 5 is a cross-sectional view of a stress relaxation layer provided in the electronic device shown in FIG. 1.
Figure 6:
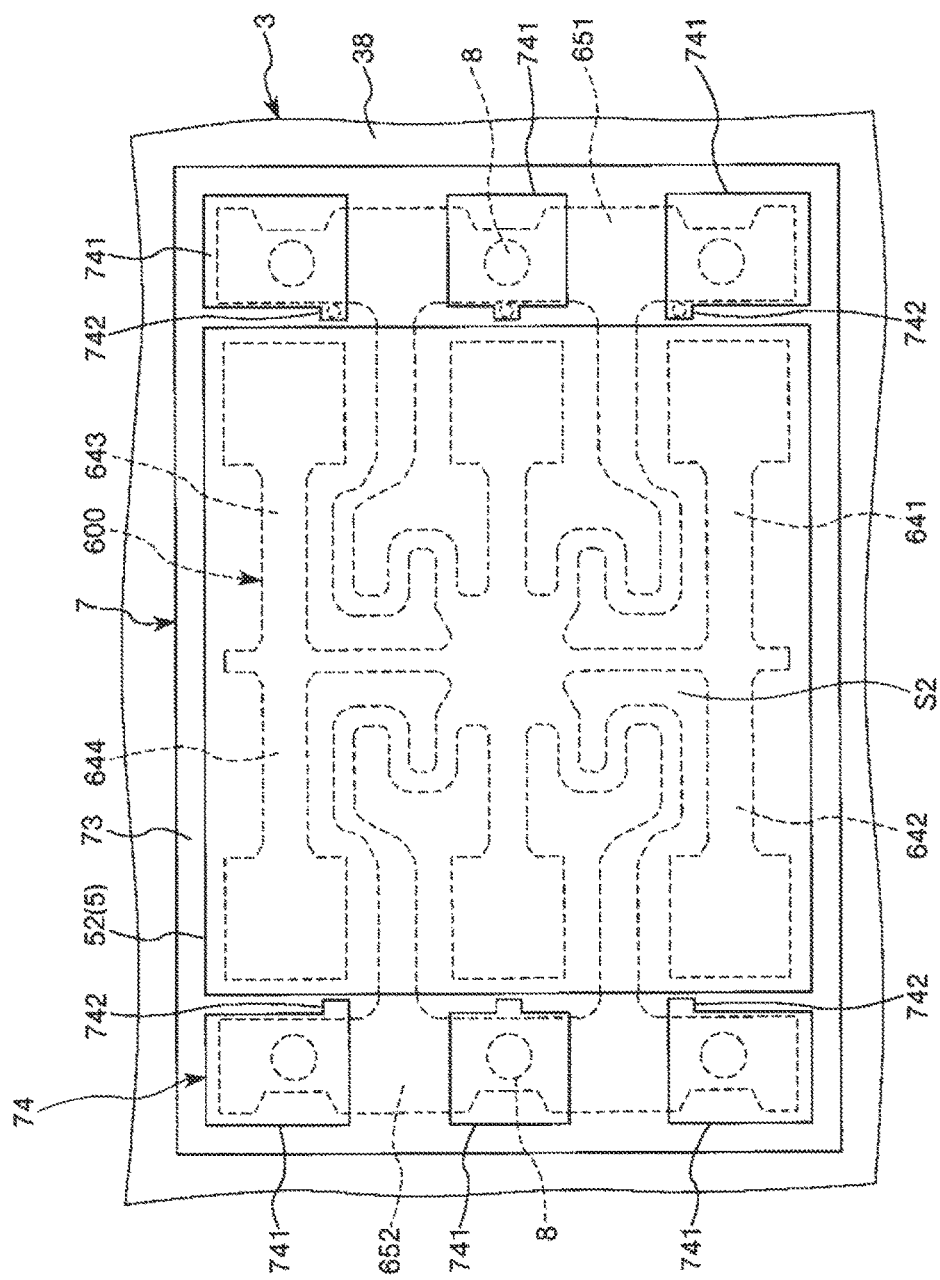
FIG. 6 is a plan view of a protective layer shown in FIG. 5.
Figure 7:
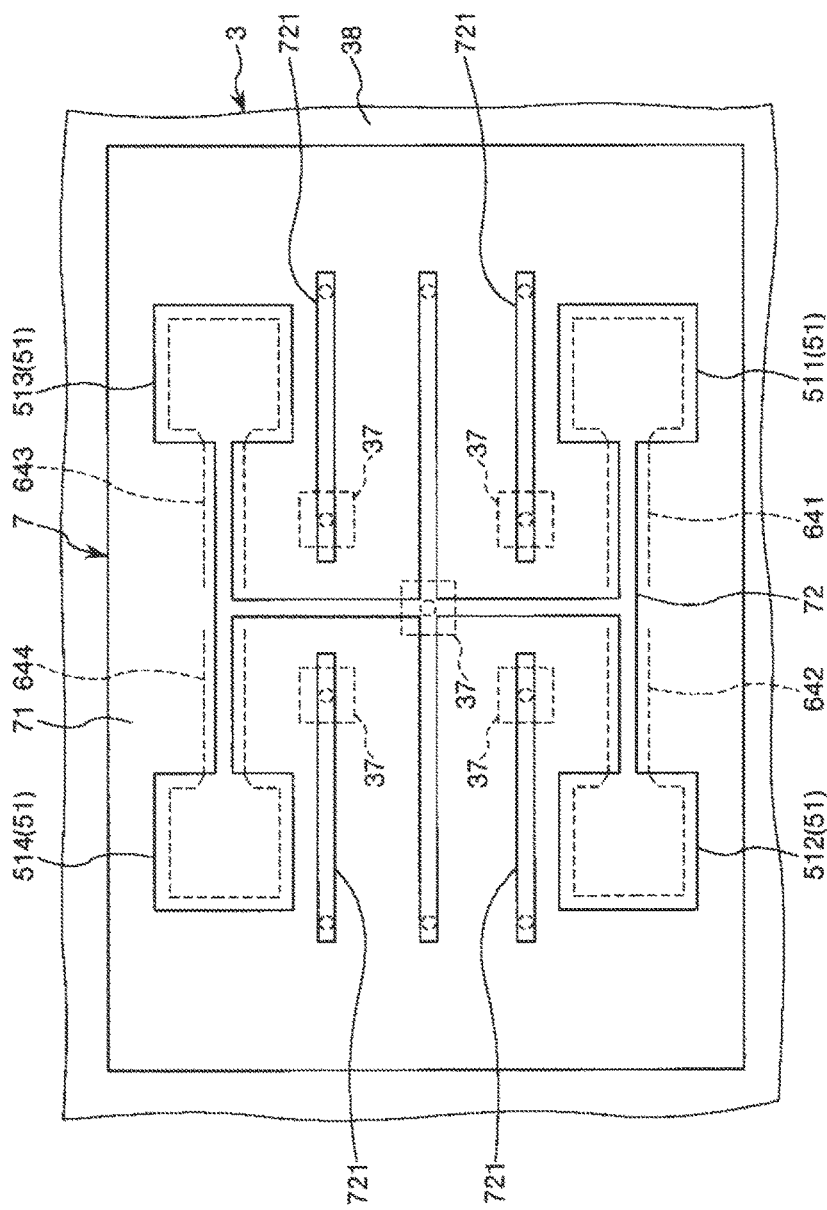
FIG. 7 is another plan view of the protective layer shown in FIG. 5.
Figure 8:
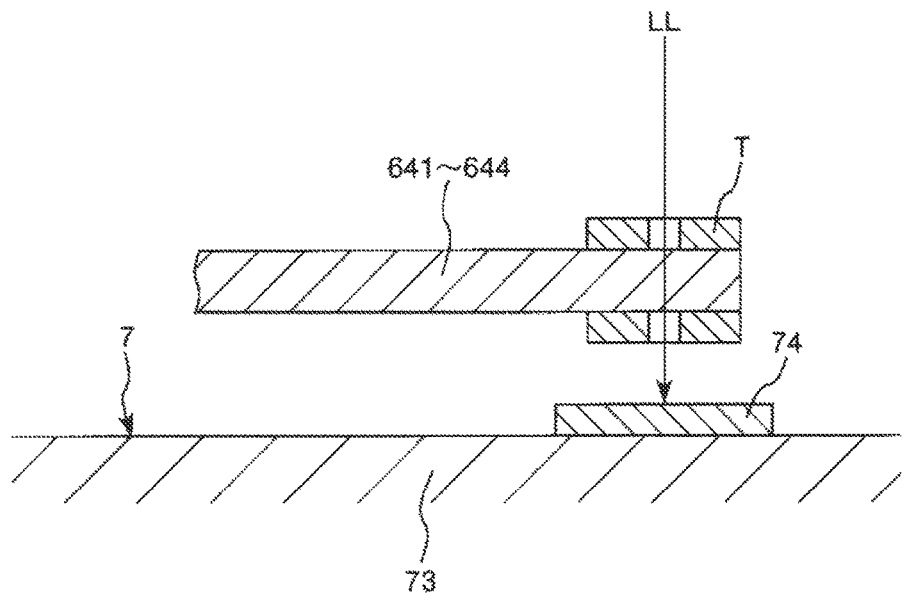
FIG. 8 is a cross-sectional view for describing the function of the protective layer shown in FIG. 5.

FIG. 1 is a cross-sectional view showing an electronic device according to a first embodiment of the invention. FIG. 2 is a plan view of an vibration element provided in the electronic device shown in FIG. 1. FIGS. 3A and 3B show the arrangement of electrodes of the vibration element shown in FIG. 2. FIG. 3A is a top view, and FIG. 3B is a see-through view. FIGS. 4A and 4B are diagrammatic views for describing the action of the vibration element shown in FIG. 2. FIG. 5 is a cross-sectional view of a stress relaxation layer provided in the electronic device shown in FIG. 1. FIG. 6 is a plan view of a protective layer shown in FIG. 5. FIG. 7 is another plan view of the protective layer shown in FIG. 5. FIG. 8 is a cross-sectional view for describing the function of the protective layer shown in FIG. 5. In the following description, the upper side in FIG. 1 is also called an "upper side," and the lower side in FIG. 1 is also called a "lower side" for ease of description. Further, three axes perpendicular to each other are called an X axis, a Y axis, and a Z axis, and the thickness direction of the electronic device is assumed to coincide with the Z axis, as shown in FIG. 1.

An electronic device 1 shown in FIG. 1 is an angular velocity sensor capable of detecting angular velocity ωz around the Z axis. The thus functioning electronic device 1 includes a package 2, which has an accommodation space S provided therein, an IC (semiconductor substrate) 3, which is accommodated in the accommodation space S, a stress relaxation layer 7, which is disposed on the IC 3, a protective layer 5, which is disposed on the stress relaxation layer 7, and an vibration element 6, which is disposed on the stress relaxation layer 7.

The portions described above will be sequentially described below.

Package

The package 2 includes a box-shaped base 21, which has a recess 211, which opens through the upper surface of the base 21, a plate-shaped lid 22, which blocks the opening of the recess 211, and a seam ring 23, which is interposed between the base 21 and the rid 22 and bonds them to each other. The accommodation space S, which is formed when the opening of the recess 21 is blocked with the lid 22, accommodates the IC 3 and the vibration element 6. The atmosphere in the accommodation space S is not limited to a specific atmosphere and is, for example, a vacuum (having reduced pressure lower than or equal to 10 Pa). The vacuum reduces viscous resistance and allows the vibration element 6 to be efficiently driven.

Base 21

The base 21 has a roughly square shape in a plan view. The recess 211 has a first recess 211a, which opens through the upper surface of the base 21, and a second recess 211b, which opens in a central portion of the bottom surface of the first recess 211a except an edge portion thereof. The base 21 does not necessarily have a specific shape in a plan view and may have, for example, a rectangular or circular shape. The thus shaped base 21 can be formed, for example, by sintering a plurality of aluminum-oxide-based, aluminum-nitride-based, silicon-carbide-based, mullite-based, or glass-ceramic-based ceramic green sheets layered on each other.

A plurality of internal terminals 241, which are electrically connected to the IC 3 via bonding wires BW, are disposed on the bottom surface of the first recess 211a, and a plurality of external terminals 242 are disposed on the bottom surface of the base 21. The internal terminals 241 and the external terminals 242 are electrically connected to each other, for example, via internal wiring lines that are not shown but are disposed in the base 21. The configuration of the internal terminals 241 and the external terminals 242 is not limited to a specific configuration and can, for example, be a configuration in which a ground layer made, for example, of tungsten (W), molybdenum (Mo), or manganese (Mg) is coated with gold (Au) plated layers or any other metal plated layers.

The lid 22 has a plate-like shape and is bonded to the upper surface of the base 21 via the seam ring 23. The lid 22 is not necessarily made of a specific material and is preferably made, for example, of kovar or any other alloy. The lid 22 may, for example, be electrically connected to a ground wiring line via the seam ring 23. The lid 22 is thus allowed to function as a shield that shields noise outside the package 2.

IC

The IC 3 is fixed to the bottom surface of the second recess 211b, for example, with a silver paste. The IC 3 includes, for example, an interface 3i, which communicates with an external host device, a drive/detection circuit 3z, which drives the vibration element 6 and detects the angular velocity ωz acting on the vibration element 6. A plurality of connection terminals 39 are disposed on the upper surface of the IC 3, and the connection terminals 39 are connected to the internal terminals 241 via the bonding wires BW. The IC 3 is thus allowed to communicate with the host device via the external terminals 242. The communication method employed by the IC 3 is not limited to a specific method and can, for example, be SPI (registered trademark) (Serial Peripheral Interface) or I²C (registered trademark) (Inter-Integrated Circuit). The IC 3 may instead have a selection function of selecting one of the SPI and I²C communication methods. The electronic device 1 can thus be a highly convenient device that supports a plurality of communication methods.

Vibration Element

The vibration element 6 includes an vibration piece 60 made of quartz and electrodes disposed on the vibration piece 60, as shown in FIG. 2 and FIGS. 3A and 3B. The vibration piece 60 is not necessarily made of quartz and can be made, for example, of a lithium tantalite, a lithium niobate, or any other piezoelectric material.

The vibration piece 60 has a plate-like shape that extends in an xy plane defined by an x axis (electrical axis) and a y axis (mechanical axis) that are crystal axes of quartz and has a thickness in a z-axis (optical axis) direction. The thus shaped vibration piece 60 has a base section 61, a pair of detection vibration arms 621 and 622, which extend from the base section 61 in opposite directions along the y axis, a pair of linkage arms 631 and 632, which extend from the base section 61 in opposite directions along the x axis, a pair of drive vibration arms 641 and 642, which extend from a front end portion of the linkage arm 631 in opposite directions along the y axis, a pair of drive vibration arms 643 and 644, which extend from a front end portion of the linkage arm 632 in opposite directions along the y axis, a pair of support sections 651 and 652, which support the base section 61, a pair of beams 661 and 662, which link the support section 651 to the base section 61, and a pair of beams 663 and 664, which link the support section 652 to the base section 61. In the thus configured vibration piece 60, the base section 61, the detection vibration arms 621 and 622, the linkage arms 631 and 632, and the drive vibration arms 641 to 644 form an vibration body 600.

Each of both principal surfaces (upper and lower surfaces) of each of the detection vibration arms 621 and 622 has a groove formed therein and extending along the y-axis direction, and each of the detection vibration arms 621 and 622 therefore has a roughly H-like transverse cross-sectional shape. Further, each of the detection vibration arms 621 and 622 and the drive vibration arms 641, 642, 643, and 644 has a wide-width hammer head provided at a front end portion of the vibration arm. Each of the hammer heads is provided with a mass adjustment electrode (adjustment section), and at least part of the mass adjustment electrode is removed, for example, by laser irradiation for adjustment of the mass of the vibration arm. The vibration piece 60 is not necessarily configured as described above. For example, the grooves in the detection vibration arms 621 and 622 may be omitted, and the hammer heads of the detection vibration arms 621 and 622 and the drive vibration arms 641, 642, 643, and 644 may be omitted. Further, a groove may be formed in each of both principal surfaces of each of the drive vibration arms 641, 642, 643, and 644 so that the vibration arm has a roughly H-like transverse cross-sectional shape.

A description will next be made of electrodes disposed on the vibration piece 60. The electrodes are formed of detection signal electrodes 671a and detection signal terminals 671b, detection grounded electrodes 672a and detection grounded terminals (fixed potential terminals) 672b, drive signal electrodes 673a and a drive signal terminal 673b, and drive grounded electrodes 674a and a drive grounded terminal 674b, as shown in FIGS. 3A and 3B. In FIGS. 3A and 3B, the detection signal electrodes 671a and the detection signal terminals 671b, the detection grounded electrodes 672a and the detection grounded terminals 672b, the drive signal electrodes 673a and the drive signal terminal 673b, and the drive grounded electrodes 674a and the drive grounded terminal 674b are hatched differently from one another for ease of description. Further, electrodes, wiring lines, terminals, and other components formed on the side surface of the vibration piece 60 are drawn with thick lines.

Drive Signal Electrodes and Drive Signal Terminal

The drive signal electrodes 673a are formed on the upper and lower surfaces of the drive vibration arms 641 and 642 (on portions excluding hammer heads) and on the opposite side surfaces of the drive vibration arms 643 and 644. The thus disposed drive signal electrodes 673a are electrodes for exciting the drive vibration arms 641 to 644 in such a way that they undergo drive vibration.

The drive signal terminal 673b is disposed on a −X-axis-side end portion of the support section 652. The drive signal terminal 673b is electrically connected to the drive signal electrodes 673a disposed on the drive vibration arms 641 to 644 via drive signal wiring lines disposed on the beam 664.

Drive Grounded Electrodes and Drive Grounded Terminal

The drive grounded electrodes 674a are disposed on the upper and lower surfaces of the drive vibration arms 643 and 644 (on portions excluding hammer heads) and on the opposite side surfaces of the drive vibration arms 641 and 642. The thus disposed drive grounded electrodes 674a have ground potential with respect to the drive signal electrodes 673a.

The drive grounded terminal 674b is disposed on a −X-axis-side end portion of the support section 651. The drive grounded terminal 674b is electrically connected to the drive grounded electrodes 674a disposed on the drive vibration arms 641 to 644 via drive grounded wiring lines disposed on the beam 662.

Arranging the drive signal electrodes 673a, the drive signal terminal 673b, the drive grounded electrodes 674a, and the drive grounded terminal 674b as described above and applying a drive signal (voltage) between the drive signal terminal 673b and the drive grounded terminal 674b allow electric fields to be produced between the drive signal electrodes 673a and the drive grounded electrodes 674a disposed on the drive vibration arms 641 to 644 so that the drive vibration arms 641 to 644 undergo drive vibration.

Detection Signal Electrodes and Detection Signal Terminal

The detection signal electrodes 671a are disposed on the upper and lower surfaces (inner surfaces of the grooves) of the detection vibration arms 621 and 622. The thus disposed detection signal electrodes 671a are electrodes for detecting, when the detection vibration arms 621 and 622 are so excited that they undergo detection vibration, electric charge produced by the detection vibration.

The detection signal terminals 671b are so disposed that one of them is disposed on the support section 651 and the other is disposed on the support section 652. The detection signal terminal 671b disposed on the support section 651 is disposed on a +x-axis-side end portion of the support section 651 and electrically connected to the detection signal electrodes 671a disposed on the detection vibration arm 621 via detection signal wiring lines formed on the beam 661. On the other hand, the detection signal terminal 671b disposed on the support section 652 is disposed on a +X-axis-side end portion of the support section 652 and electrically connected to the detection signal electrodes 671*a* disposed on the detection vibration arm 622 via detection signal wiring lines disposed on the beam 663.

Detection Grounded Electrodes and Detection Grounded Terminal

The detection grounded electrodes 672*a* are disposed on the opposite side surfaces of the detection vibration arms 621 and 622. The detection grounded electrodes 672*a* disposed on the opposite side surfaces of the detection vibration arm 621 are electrically connected to each other via the hammer head of the detection vibration arm 621, and the detection grounded electrodes 672*a* disposed on the opposite side surfaces of the detection vibration arm 622 are electrically connected to each other via the hammer head of the detection vibration arm 622. The thus configured detection grounded electrodes 672*a* have ground potential (fixed potential) with respect to the detection signal electrodes 671*a*.

The detection grounded terminals 672*b* are disposed on the support sections 651 and 652. The detection grounded terminal 672*b* disposed on the support section 651 is disposed in a central portion of the support section 651 and electrically connected to the detection grounded electrodes 672*a* disposed on the detection vibration arm 621 via detection grounded wiring lines disposed on the beam 662. On the other hand, the detection grounded terminal 672*b* disposed on the support section 652 is disposed in a central portion of the support section 652 and electrically connected to the detection grounded electrodes 672*a* disposed on the detection vibration arm 622 via detection grounded wiring lines disposed on the beam 664.

In the arrangement of the detection signal electrodes 671*a*, the detection signal terminals 671*b*, the detection grounded electrodes 672*a*, and the detection grounded terminals 672*b* as described above, detection vibration that the detection vibration arm 621 undergoes appears in the form of electric charge between the detection signal electrodes 671*a* and the detection grounded electrodes 672*a* disposed on the detection vibration arm 621, and the electric charge can be extracted in the form of a signal from the detection signal terminal 671*b* and the detection grounded terminal 672*b* disposed on the support section 651. Similarly, detection vibration that the detection vibration arm 622 undergoes appears in the form of electric charge between the detection signal electrodes 671*a* and the detection grounded electrodes 672*a* disposed on the detection vibration arm 622, and the electric charge can be extracted in the form of a signal from the detection signal terminal 671*b* and the detection grounded terminal 672*b* disposed on the support section 652.

Each of the electrodes described above is not necessarily configured in a specific manner as long as it is conductive and may be formed, for example, of a metal coating that is a laminate of a Ni (nickel) coating, a Au (gold) coating, a Ag (silver) coating, a Cu (copper) coating, or any other coating and an underlying metalized layer (ground layer) made, for example, of Cr (chromium) or W (tungsten).

Although not shown, the hammer head of each of the drive vibration arms 641 to 644 is provided with an adjustment weight for adjustment of a drive frequency. The adjustment of the drive frequency is, for example, removal of part of the adjustment weight by laser irradiation to change the mass of each of the drive vibration arms 641 to 644 or a task of adjusting the drive frequency. The task allows the drive vibration arms 641 to 644 to efficiently oscillate.

The thus configured vibration element 6 is fixed to the stress relaxation layer 7 at the support sections 651 and 652. The vibration element 6 is fixed to the stress relaxation layer 7 via a fixing member (connection member) 8 having conductivity, and the vibration element 6 is electrically connected to the IC 3 via the fixing member 8 and the stress relaxation layer 7. The fixing member 8 is not necessarily made of a specific material and can be made, for example, of a metal brazing material, a metal bump material, or a conductive adhesive.

The action of the vibration element 6 will next be described.

In a state in which no angular velocity acts on the vibration element 6, when a drive signal (alternate voltage) is applied between the drive signal terminal 673*b* and the drive grounded terminal 674*b* so that electric fields are produced between the drive signal electrodes 673*a* and the drive grounded electrodes 674*a*, each of the drive vibration arms 641, 642, 643, and 644 undergoes bending vibration in the direction indicated by the arrows A, as shown in FIG. 4A. In this process, since the drive vibration arms 641 and 642 and the drive vibration arms 643 and 644 oscillate symmetrically with respect to the base section 61, the detection vibration arms 621 and 622 hardly vibrate.

In the state in which the drive vibration occurs, when angular velocity $\omega z$ acts on the vibration element 6, detection vibration shown in FIG. 4B is caused to occur. Specifically, Coriolis force in the direction indicated by the arrows B acts on the drive vibration arms 641 to 644 and the linkage arms 631 and 632 and produces new oscillation. In response to the oscillation in the direction indicated by the arrows B, the detection vibration arms 621 and 622 are caused to undergo detection vibration in the direction indicated by the arrows C. Electric charge produced in the detection vibration arms 621 and 622 by the oscillation is then extracted in the form of a signal from the detection signal electrodes 671*a* and the detection grounded electrodes 672*a*, and the signal is transmitted from the detection signal terminals 671*b* and the detection grounded terminals 672*b* to the IC 3. The IC3 then processes the signal to determine the angular velocity $\omega z$.

Stress Relaxation Layer

The stress relaxation layer 7 is located between the IC 3 and the vibration element 6 and provided on the upper surface of the IC 3, as shown in FIG. 5. Providing the stress relaxation layer 7 as described above allows relaxation of impact acting on the package 2 so that the impact is unlikely to be transmitted to the vibration element 6. The stress relaxation layer 7 further allows relaxation of stress produced resulting from a difference in thermal expansion between the IC 3 and the vibration element 6 so that the vibration element 6 is unlikely to bend. As a result, the mechanical strength of the electronic device 1 can be increased, and the angular velocity $\omega z$ can be detected with increased precision.

The stress relaxation layer 7 has a first insulating layer 71, which is disposed on the upper surface (passivation film 38) of the IC 3, a first wiring layer 72, which is disposed on the first insulating layer 71 and electrically connected to the IC 3, a second insulating layer 73, which is formed on the first wiring layer 72 and the first insulating layer 71, and a second wiring layer 74, which is formed on the second insulating layer 73 and electrically connected to the first wiring layer 72.

Each of the first and second insulating layers 71, 73 is made of a resin material having elasticity. The resin material is not limited to a specific material and can, for example, be polyimide, a silicone-modified polyimide resin, an epoxy resin, a silicone-modified epoxy resin, an acrylic resin, a phenol resin, a silicone resin, a modified polyimide resin, benzocyclobutene, or polybenzoxazole. The first and second insulating layers 71, 73 can thus be so formed that they have sufficient elasticity, whereby the advantageous effects described above can be reliably provided.

The second wiring layer 74 has six terminals (connection pads) 741, which are so disposed on the second insulating layer 73 that they face the terminals (connection electrodes) 671b to 674b of the vibration element 6, and six wiring sections 742, which are connected to the terminals 741, as shown in FIG. 6. The vibration element 6 is then fixed to the terminals 741 via the fixing member 8. On the other hand, the first wiring layer 72 has wiring sections (wiring lines) 721, which are disposed on the first insulating layer 71 and electrically connect the wiring sections 742 to terminals 37 of the IC 3, as shown in FIG. 7. As a result, the IC 3 is electrically connected to the vibration element 6 via the fixing member 8 and the first and second wiring layers 72, 74. As described above, the first and second wiring layers 72, 74 function as wiring lines for electrically connecting the IC 3 to the vibration element 6 (rearrangement wiring lines). The terminals 37 of the IC 3 can therefore be freely arranged with no consideration of the positions of the terminals 671b to 674b of the vibration element 6. The electronic device 1 can therefore be designed with increased flexibility.

The wiring sections 742 of the second wiring layer 74 extend from the terminals 741 toward the base section 61 of the vibration element 6, as shown in FIG. 6. In other words, the wiring sections 742 extend from the terminals 741 toward the interior of an area S2 sandwiched between the support sections 651 and 652 in a plan view. Further, the terminals 37 of the IC 3 are also disposed in the area S2 in the plan view. Employing the configuration described above allows the wiring sections 721 and 742 to be routed in the area S2 so as to suppress expansion of the first and second wiring layers 72, 74 in the plan view. The size of the stress relaxation layer 7 can therefore be reduced (the area of the stress relaxation layer 7 in the plan view can be reduced).

The wiring sections 721 and 742 are so routed that they do not overlap with the hammer heads of the drive vibration arms 641 to 644 of the vibration element 6 in the plan view. As a result, when laser light LL used when the drive frequency is adjusted is irradiated, the degree of damage (breakage) of the wiring sections 721 and 742 can be reduced.

Protective Layer

The protective layer 5 has a first protective layer 51, which is disposed on the first insulating layer 71, and a second protective layer 52, which is disposed on the second insulating layer 73.

The first protective layer 51 has a first portion 511, which is so positioned that it overlaps with the hammer head of the drive vibration arm 641 in the plan view, a second portion 512, which is so positioned that it overlaps with the hammer head of the drive vibration arm 642, a third portion 513, which is so positioned that it overlaps with the hammer head of the drive vibration arm 643, and a fourth portion 514, which is so positioned that it overlaps with the hammer head of the drive vibration arm 644, as shown in FIG. 7. The thus configured first to fourth portions 511 to 514 allow provision of spaces therebetween for routing the wiring sections 721 of the first wiring layer 72. On the other hand, the second protective layer 52 is so disposed that it overlaps with the vibration body 600 of the vibration element 6 in the plan view, as shown in FIG. 6. The second protective layer 52 in the present embodiment, in particular, is so disposed that it covers the entire area of the vibration body 600 in the plan view.

The thus configured protective layer 5 has a function of suppressing (preferably preventing) melting of the stress relaxation layer 7 and the IC 3 that occurs when the drive vibration arms 641 to 644 are irradiated with the laser light. The function will be described below. In the vibration element 6, the drive vibration arms 641 to 644 are so irradiated with the laser light LL that part of the adjustment electrode (adjustment section) T on the hammer head of each of the drive vibration arms 641 to 644 is removed for adjustment of the mass of each of the drive vibration arms 641 to 644 and hence adjustment of the drive frequency and oscillation balance, as shown in FIG. 8. In this process, the laser light LL passes through the drive vibration arms 641 to 644 and impinges in some cases on the stress relaxation layer 7, which is immediately below the drive vibration arms 641 to 644. When the laser light LL having passed through the drive vibration arms 641 to 644 impinges on the stress relaxation layer 7, part of the stress relaxation layer 7 melts, resulting in breakage of the first and second wiring layers 72, 74 or conversely resulting in a short circuit in some cases. To avoid such situations, in the present embodiment, the protective layer 5 is provided over an area of the stress relaxation layer 7 that may be irradiated with the laser light LL having passed through the drive vibration arms 641 to 644 so that the protective layer 5 absorbs at least part of the laser light LL, whereby the thermal damage described above can be suppressed.

In the present embodiment, in particular, the first and second protective layers 51, 52 are disposed in an overlapping manner in the area of the stress relaxation layer 7 that may be irradiated with the laser light LL (area that overlaps with the hammer heads of the drive vibration arms 641 to 644). The thus configured protective layer can more effectively suppress the thermal damage of the stress relaxation layer 7 and the IC 3.

In addition, the second protective layer 52, which is located at the superficial level and disposed over such a wide range that it covers the entire area of the vibration body 600, can more effectively suppress contamination of the detection signal electrodes 671a and the drive signal electrodes 673a with noise. Since the second protective layer 52 is disposed over a wide range of the second insulating layer 73, the size of the space for routing the wiring sections 742 of the second wiring layer 74 over the second insulating layer 73 is reduced. In view of the fact described above, the first protective layer 51, which is disposed below the second protective layer 52, is patterned as described above so that a space for routing the wiring sections 721 of the first wiring layer 72 is provided on the first insulating layer 71.

The thus configured first and second protective layers 51, 52 are not necessarily made of a specific material and are preferably made of a material that absorbs the laser light LL by a greater amount than the material of which the first and second insulating layers 71, 73 are made. A variety of metal materials can therefore be used. More specifically, each of the first and second protective layers 51, 52 can be formed, for example, of a metal film that is a laminate of an Au (gold) plated layer or any other plated layer and a ground layer made of W (tungsten), molybdenum (Mo), or manganese (Mn). The first and second protective layers 51, 52 can thus be simply configured, and the advantageous effects described above can be more effectively provided. Further, the first protective layer 51 and the first wiring layer 72 can be formed at the same time, and the second protective layer 52 and the second wiring layer 74 can be formed at the same time. The protective layer 5 can thus be readily formed.

The first and second protective layers 51, 52 are electrically connected to the detection grounded terminals 672b of the vibration element 6 via the first and second wiring layers 72, 74, respectively. As a result, each of the first and second protective layers 51, 52 has fixed potential and functions as a shielding layer. Therefore, for example, contamination of the drive signal electrodes 673a on the drive vibration arms 641 to 644 with noise can be suppressed.

Second Embodiment

Figure 9:
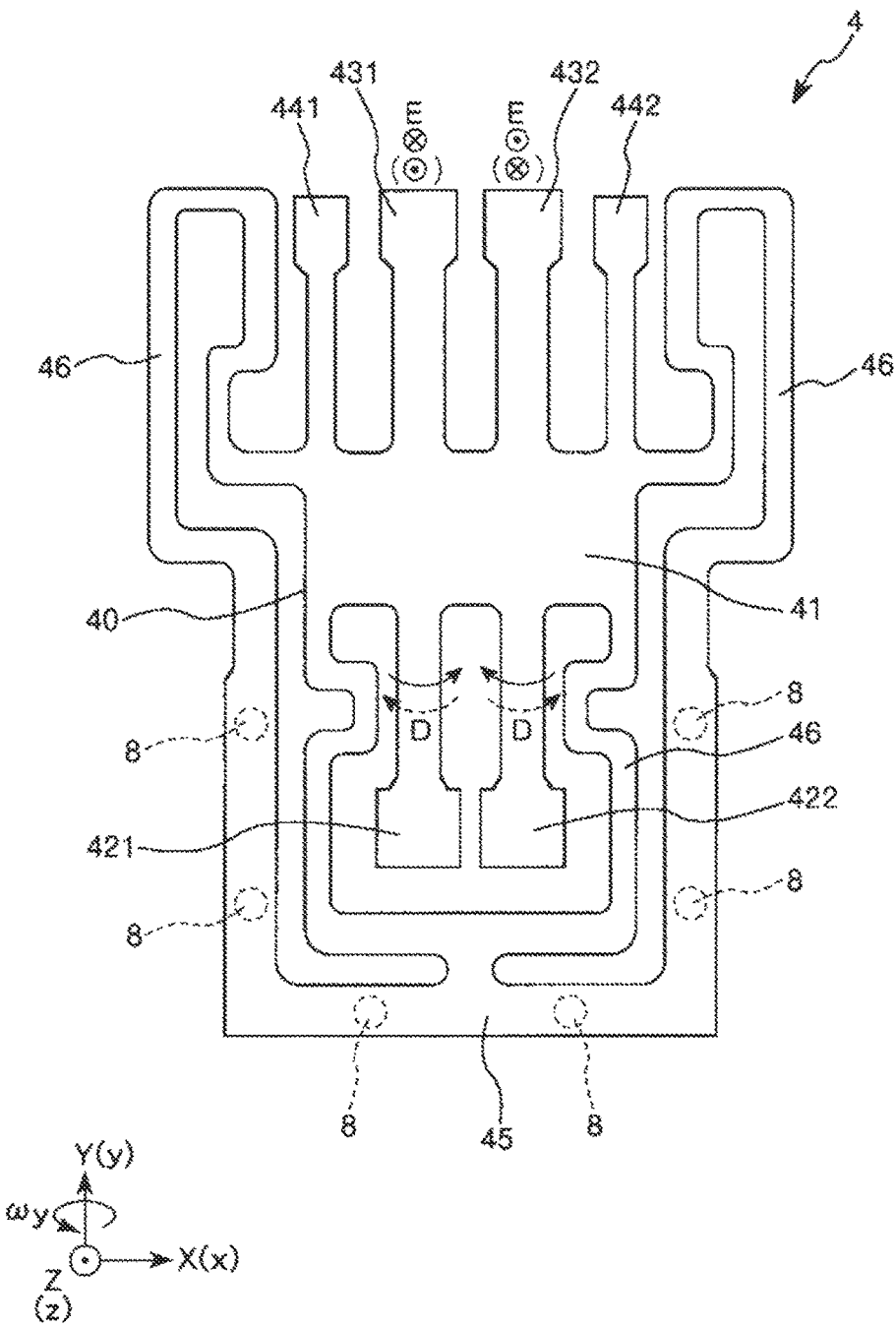
FIG. 9 is a plan view showing an vibration element provided in an electronic device according to a second embodiment of the invention.
Figure 10:
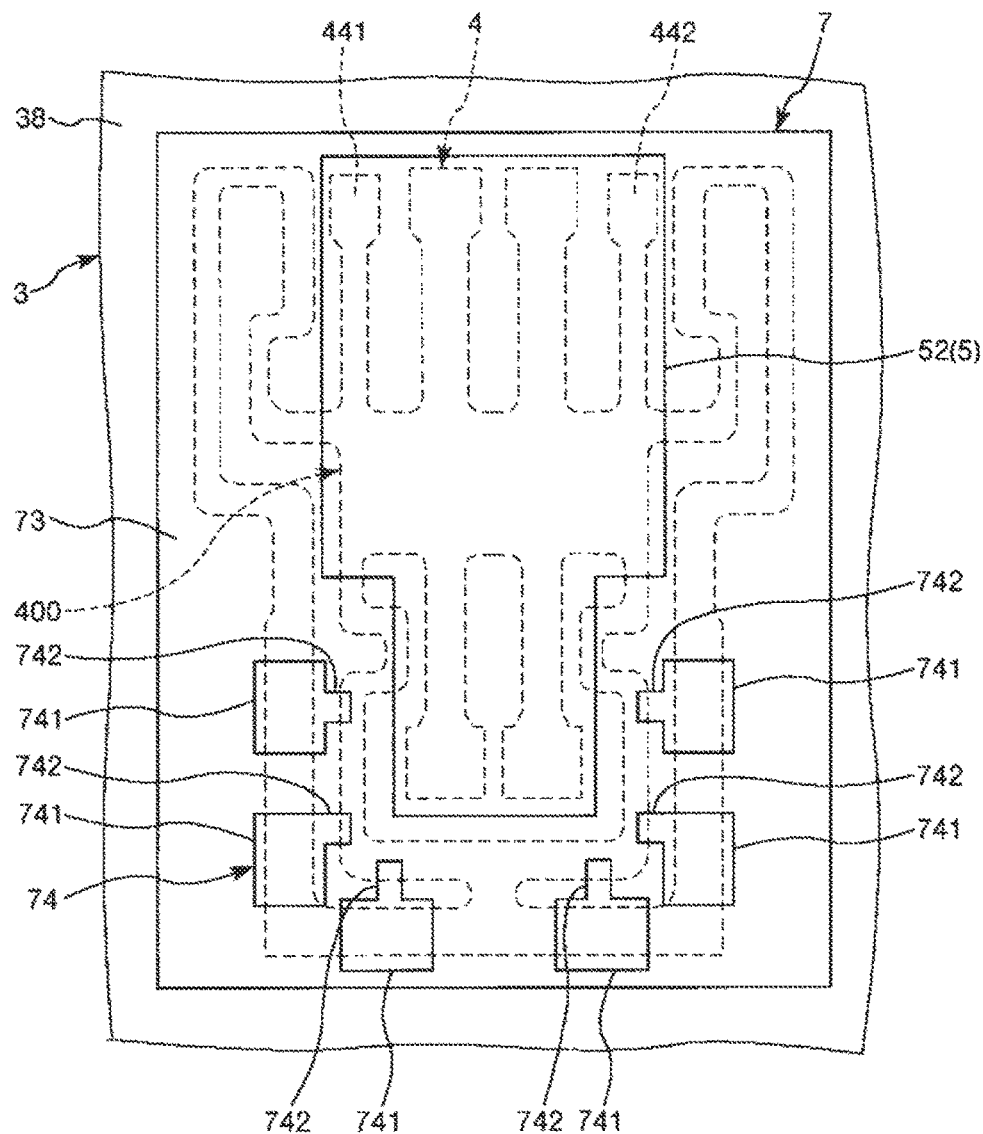
FIG. 10 is a plan view of a protective layer provided in the electronic device shown in FIG. 9.
Figure 11:
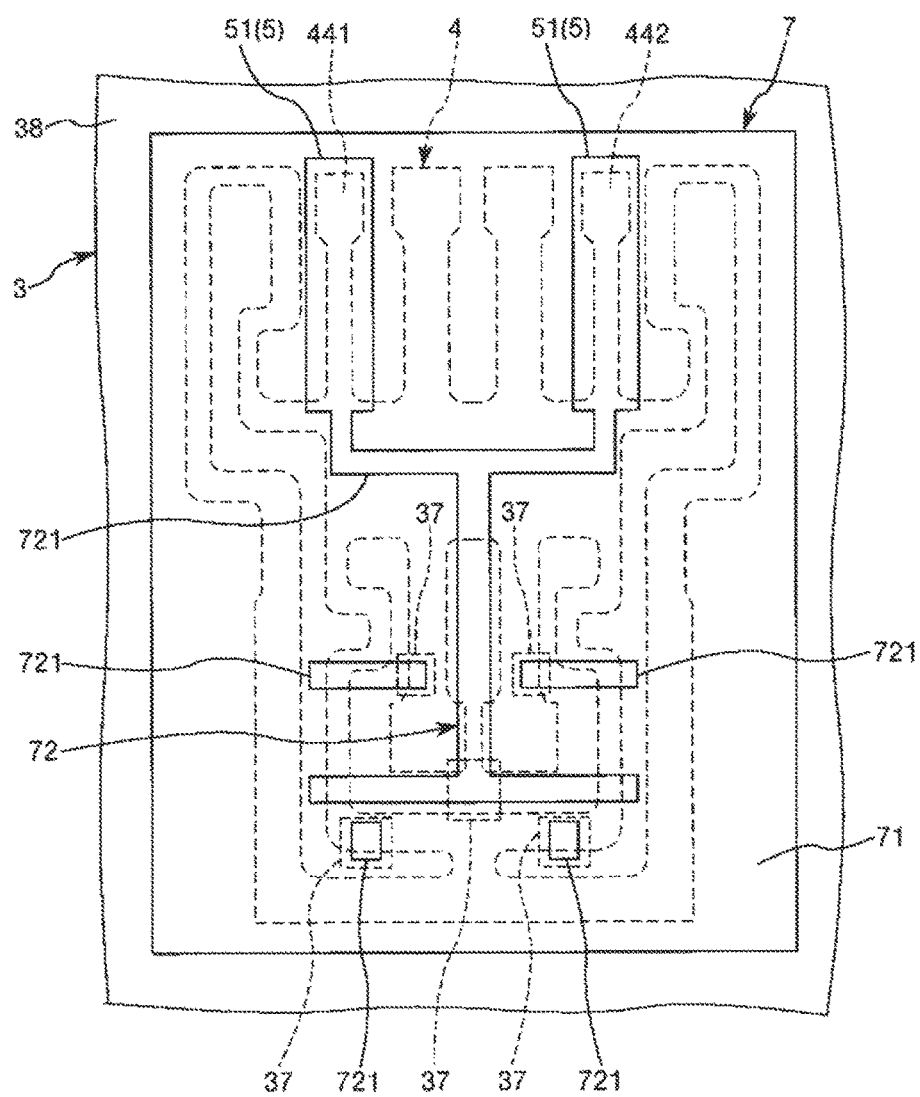
FIG. 11 is another plan view of the protective layer provided in the electronic device shown in FIG. 9.

FIG. 9 is a plan view showing an vibration element provided in an electronic device according to a second embodiment of the invention. FIG. 10 is a plan view of a protective layer provided in the electronic device shown in FIG. 9. FIG. 11 is another plan view of the protective layer provided in the electronic device shown in FIG. 9.

The second embodiment will be described below primarily on differences from the embodiment described above, and the same items will not be described.

The second embodiment differs from the first embodiment described above in terms of the configuration of the vibration element and is the same as the first embodiment in the other points.

Vibration Element

An vibration element 4 according to the present embodiment is what is called an "H-shaped" gyro element and can detect angular velocity ωy around the Y axis. The vibration element 4 includes an vibration piece 40 made of quartz and electrodes (not shown) disposed on the vibration piece 40, as shown in FIG. 9.

The vibration piece 40 has a plate-like shape that extends in an xy plane defined by the x axis and the y axis that are crystal axes of quartz and has a thickness in the z-axis direction. The vibration piece 40 has a base section 41, a pair of drive vibration arms 421 and 422, which extend from the base section 41 in the same direction along the −y axis, a pair of detection vibration arms 431 and 432, which extend from the base section 41 in the same direction along the +y axis, a pair of adjustment vibration arms 441 and 442, which extend from the base section 41 along the +y axis and are disposed on opposite sides of the detection vibration arms 431 and 432, a support section 45, which supports the base section 41, and a linkage section 46, which links the support section 45 to the base section 41. In the thus configured vibration piece 40, the base section 41, the drive vibration arms 421 and 422, the detection vibration arms 431 and 432, and the adjustment vibration arms 441 and 442 form an vibration body 400.

The drive vibration arms 421 and 422 are provided with drive electrodes that are not shown, and when the IC 3 applies an oscillation drive signal (alternate voltage) to the drive electrodes, the drive vibration arms 421 and 422 are so excited that they oscillate in a drive mode in which they undergo bending vibration in opposite phases. When angular velocity ωy acts on the vibration element 4 when the drive vibration arms 421 and 422 oscillate in the drive mode, the detection vibration arms 431 and 432 are so excited that they oscillate in a detection mode in which they undergo bending vibration in opposite phases in the direction indicated by E. The detection vibration arms 431 and 432 are provided with detection electrodes that are not shown, and a detection signal (electric charge) produced by the oscillation of the detection vibration arms 431 and 432 is extracted from the detection electrodes. The IC 3 then detects the angular velocity ωy based on the extracted detection signal.

The adjustment vibration arms 441 and 442 are provided with, although not shown, adjustment electrodes (adjustment sections) for unnecessary signal cancel tuning. The unnecessary signal cancel tuning is a task of performing adjustment to cancel at least part of an unnecessary signal produced in the detection vibration arms 431 and 432 due, for example, to variation in manufacturing processes with an adjustment signal having a phase opposite the phase of the unnecessary signal. The adjustment is performed by removing part of the adjustment electrodes by laser irradiation to change the amount of electric charge carried by the adjustment signal produced by the adjustment vibration arms 441 and 442. The task can reduce the amount of the unnecessary signal contained in the detection signal produced when the drive vibration arms 421 and 422 are caused to oscillate in the drive mode with no angular velocity ω acting on the vibration element 4. The angular velocity ω can therefore be detected with higher precision.

The thus configured vibration element 4, specifically, the support section 45 thereof is fixed to the stress relaxation layer 7. The vibration element 4 is fixed to the stress relaxation layer 7 via the fixing member 8 having conductivity, and the vibration element 4 is electrically connected to the IC 3 via the fixing member 8 and the stress relaxation layer 7.

Stress Relaxation Layer

The second wiring layer 74 has six terminals (connection pads) 741, which are so disposed on the second insulating layer 73 that they face the terminals (connection electrodes) of the vibration element 4, and six wiring sections 742, which are connected to the terminals 741, as shown in FIG. 10. The vibration element 4 is then fixed to the terminals 741 via the fixing member 8. On the other hand, the first wiring layer 72 has wiring sections (wiring lines) 721, which are disposed on the first insulating layer 71 and electrically connect the wiring sections 742 to terminals 37 of the IC 3, as shown in FIG. 11. As a result, the IC 3 is electrically connected to the vibration element 4 via the fixing member 8 and the first and second wiring layers 72, 74.

Protective Layer

The first protective layer 51 is so disposed that it is split into two portions that overlap with the adjustment vibration arms 441 and 442 in the plan view, as shown in FIG. 11. A space for routing the wiring sections 721 can thus be provided on the first insulating layer 71. On the other hand, the second protective layer 52 is so disposed that it overlaps with the vibration body 400 of the vibration element 4 in the plan view, as shown in FIG. 10. As described above, since the vibration element 4 is caused to undergo balance tuning in which part of the adjustment electrodes on the adjustment vibration arms 441 and 442 is removed by laser irradiation, the arrangement of the protective layer 5 described above allows suppression of thermal damage of the stress relaxation layer 7 and the IC 3.

The second embodiment described above can provide the same advantageous effects as those provided by the first embodiment described above.

Electronic Apparatus

Electronic apparatus in which the electronic device 1 is used will next be described in detail with reference to FIGS. 12 to 14.

Figure 12:
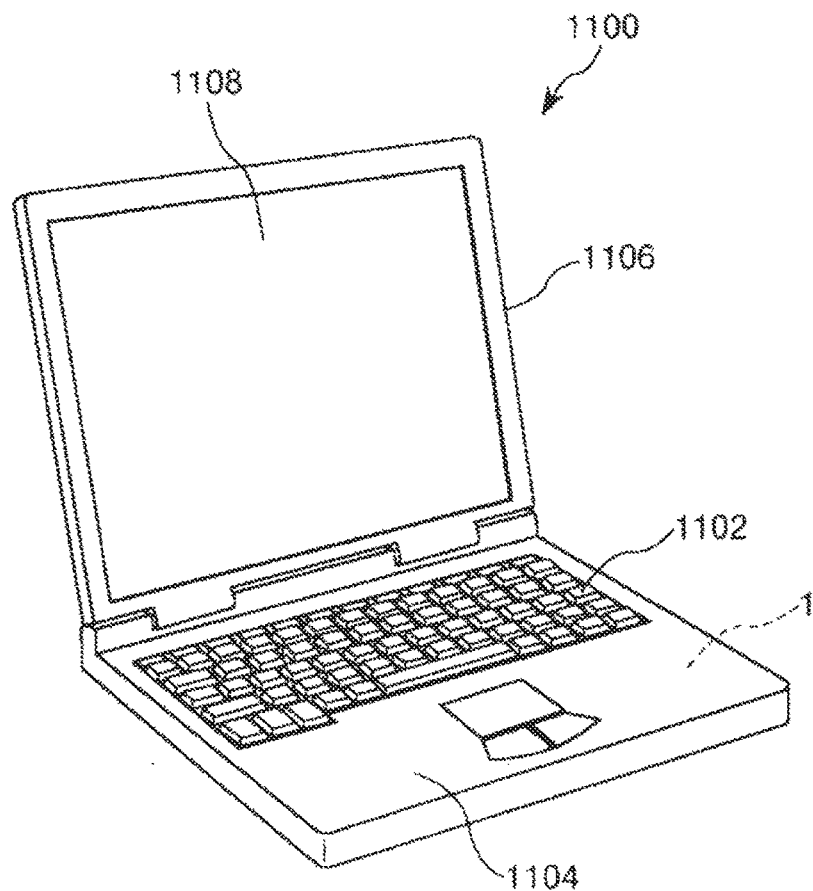
FIG. 12 is a perspective view showing the configuration of a mobile (or notebook) personal computer as an electronic apparatus including an electronic device according to any of the embodiments of the invention.

FIG. 12 is a perspective view showing the configuration of a mobile (or notebook) personal computer as the electronic apparatus including the electronic device according to any of the embodiments of the invention.

In FIG. 12, a personal computer 1100 is formed of the following components: a body section 1104 including a keyboard 1102; and a display unit 1106 including a display section 1008, and the display unit 1106 is so supported by the body section 1104 via a hinge structure that the display unit 1106 is pivotal relative to the body section 1104. The thus configured personal computer 1100 accommodates the electronic device 1, which functions as an angular velocity detector (gyro sensor). The personal computer 1100 can therefore provide higher performance and higher reliability.

Figure 13:
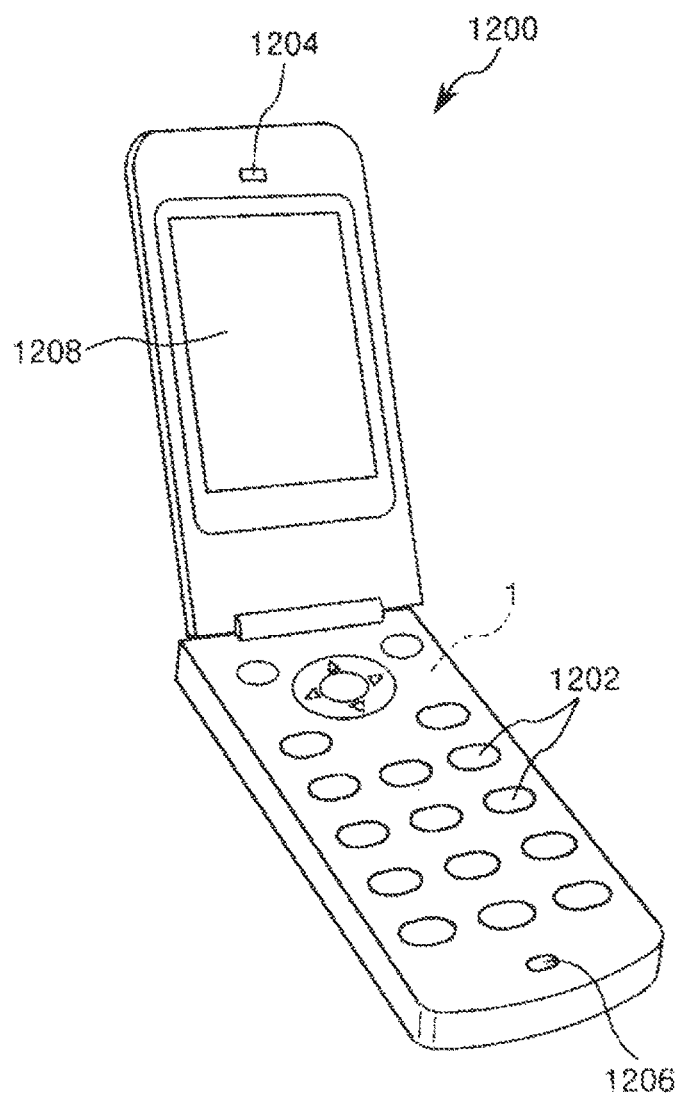
FIG. 13 is a perspective view showing the configuration of a mobile phone (including PHS) as an electronic apparatus including the electronic device according to any of the embodiments of the invention.

FIG. 13 is a perspective view showing the configuration of a mobile phone (including PHS) as the electronic apparatus including the electronic device according to any of the embodiments of the invention.

In FIG. 13, a mobile phone 1200 includes a plurality of operation buttons 1202, a receiver 1204, and a transmitter 1206, and a display section 1208 is disposed between the operation buttons 1202 and the receiver 1204. The thus configured mobile phone 1200 accommodates the electronic device 1, which functions as an angular velocity detector (gyro sensor). The mobile phone 1200 can therefore provide higher performance and higher reliability.

Figure 14:
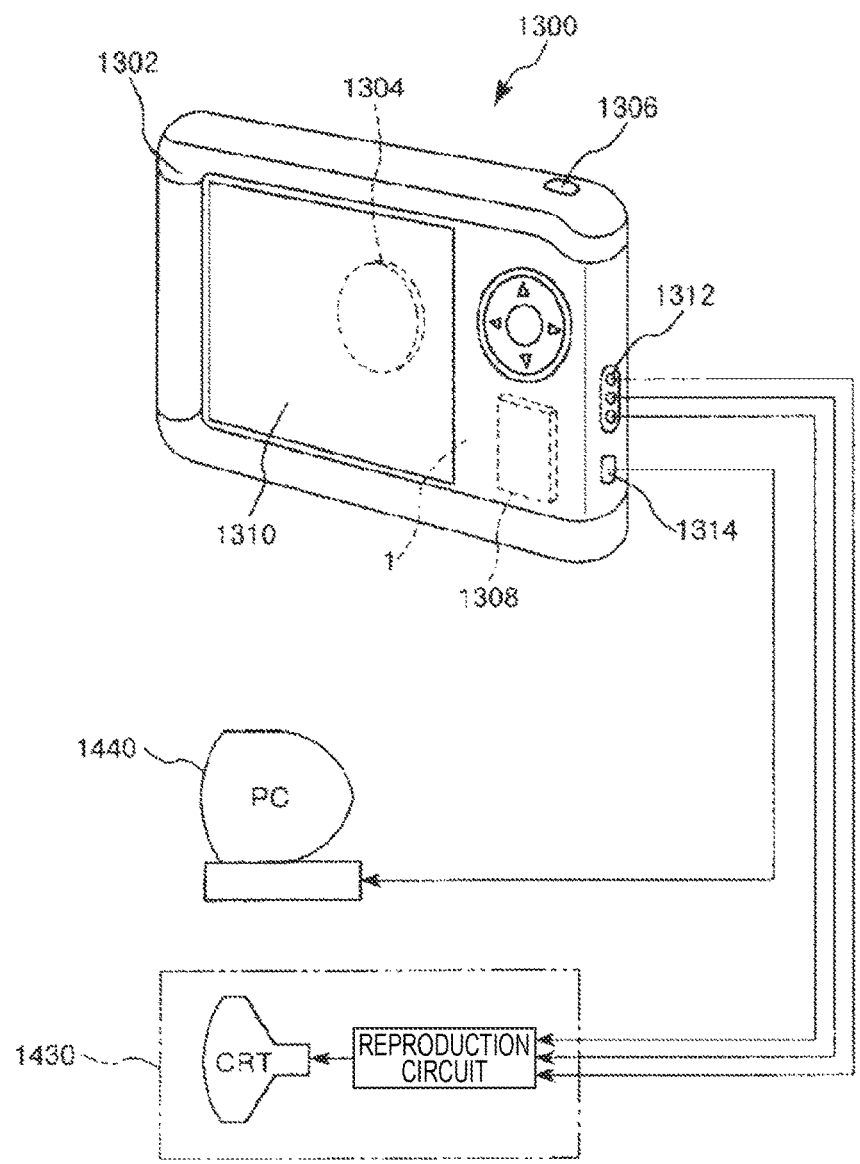
FIG. 14 is a perspective view showing the configuration of a digital still camera as an electronic apparatus including the electronic device according to any of the embodiments of the invention.

FIG. 14 is a perspective view showing the configuration of a digital still camera as the electronic apparatus including the electronic device according to any of the embodiments of the invention. The connection to an external device is also shown in FIG. 14 in a simplified manner.

A digital still camera 1300 converts an optical image of a subject into a captured image signal (image signal) in a photoelectric conversion process by using a CCD (charge coupled device) or any other imaging device. A display section 1310 is provided on the rear side of a case (body) 1302 of the digital still camera 1300 and displays an image based on the captured image signal from the CCD. The display section 1310 thus functions as a finder that displays a subject in the form of an electronic image. Further, a light receiving unit 1304 including an optical lens (imaging system), the CCD, and other components is provided on the front side (rear side in FIG. 14) of the case 1302. When a user of the camera checks a subject image displayed on the display section 1310 and presses a shutter button 1306, a captured image signal from the CCD at that point of time is transferred to and stored in a memory 1308.

Further, in the digital still camera 1300, a video signal output terminal 1312 and a data communication input/output terminal 1314 are provided on a side surface of the case 1302. The video signal output terminal 1312 is connected to a television monitor 1430 as necessary, and the data communication input/output terminal 1314 is connected to a personal computer 1440 as necessary, as shown in FIG. 14. Further, in response to predetermined operation, a captured image signal stored in the memory 1308 is outputted to the television monitor 1430 or the personal computer 1440.

The thus configured digital still camera 1300 accommodates the electronic device 1, which functions as an angular velocity detector (gyro sensor). The digital still camera 1300 can therefore provide higher performance and higher reliability.

An electronic apparatus including the electronic device according to any of the embodiments of the invention can be used not only as the personal computer (mobile personal computer) shown in FIG. 12, the mobile phone shown in FIG. 13, and the digital still camera shown in FIG. 14 but also, for example, as an inkjet-type liquid ejection apparatus (inkjet printer, for example), a laptop personal computer, a television receiver, a video camcorder, a video tape recorder, a car navigator, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, air planes, and ships), and a flight simulator.

Moving Object

A moving object in which the electronic device 1 is used will next be described in detail with reference to FIG. 15.

Figure 15:
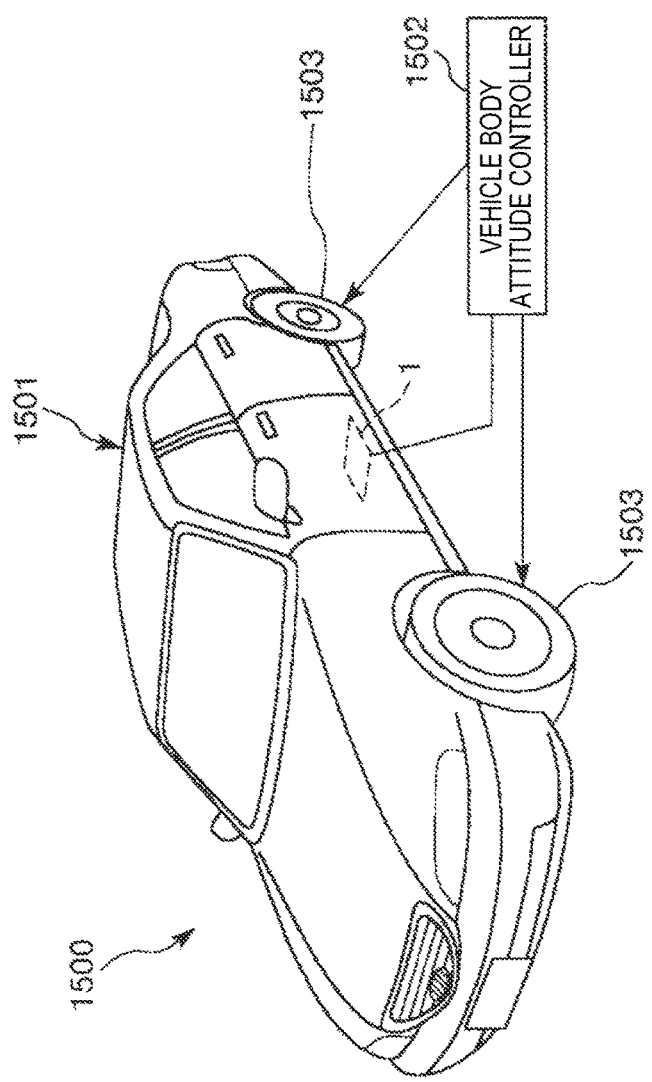
FIG. 15 is a perspective view showing the configuration of an automobile as a moving object including the electronic device according to any of the embodiments of the invention.

FIG. 15 is a perspective view showing the configuration of an automobile as the moving object including the electronic device according to any of the embodiments of the invention.

An automobile 1500 accommodates the electronic device 1, which functions as an angular velocity detector (gyro sensor), and the electronic device 1 can detect the attitude of a vehicle body 1501. A detection signal from the electronic device 1 is supplied to a vehicle body attitude controller 1502, which can detect the attitude of the vehicle body 1501 based on the signal, control the degree of rigidity of the suspension in accordance with a result of the detection, and control braking of each wheel 1503. In addition, the attitude control described above can be used with a bipedal walking robot and a radio-controlled helicopter. As described above, the electronic device 1 is incorporated to achieve attitude control in a variety of moving objects.

The electronic device, the electronic apparatus, and the moving object according to the illustrated embodiments of the invention have been described, but the invention is not limited thereto and the configuration of each portion can be replaced with an arbitrary portion configured to have the same function. Further, any other arbitrarily configured portion may be added to the embodiments of the invention. Moreover, in the invention, arbitrary two or more configurations (features) of the embodiments described above may be combined with each other.

The above embodiments have been described with reference to the configuration in which one vibration element is provided on an IC, but the number of vibration elements is not limited to a specific number. For example, an vibration element capable of detecting angular velocity around the X axis, an vibration element capable of detecting angular velocity around the Y axis, and an vibration element capable of detecting angular velocity around the Z axis may be disposed.

Further, the above embodiments have been described with reference to the angular velocity sensor as an electronic device, but the electronic device is not limited to an angular velocity sensor and may, for example, be an oscillator that outputs a signal having a predetermined frequency or a physical quantity sensor capable of detecting a physical quantity other than angular velocity (such as acceleration or atmospheric pressure).

The entire disclosure of Japanese Patent Application No: 2014-219773, filed Oct. 28, 2014 is expressly incorporated by reference herein.

What is claimed is:

1. An electronic device comprising:
   an integrated circuit (IC);
   a vibration element including:
      a vibration body provided with an adjustment section;
      an electrode disposed on the vibration body; and
      a connection electrode electrically connected to the electrode and connected to the IC via an electrically conductive connection member; and a plurality of layers disposed on an upper surface of the IC, the plurality of layers including:
    a connection pad electrically connected to the connection electrode via the electrically conductive connection member;
    a wiring line electrically connected to the connection pad and located between the connection pad and the IC; and
    a first protective layer located between the wiring line and the vibration element and disposed at a position where the adjustment section overlaps with the wiring line in a plan view.

2. The electronic device according to claim 1, wherein: the plurality of layers includes a second protective layer, the second protective layer being disposed between the first protective layer and the vibration element and overlapping the entire vibration element in the plan view.

3. The electronic device according to claim 2, wherein: the plurality of layers includes:
    a first insulating layer; and
    a second insulating layer disposed between the first insulating layer and the vibration element; and
the second protective layer is positioned between the second insulating layer and the vibration element.

4. The electronic device according to claim 3, wherein each of the first insulating layer and the second insulating layer has elasticity.

5. The electronic device according to claim 3, wherein:
the vibration body has a detection vibration arm; and
the electrode has a detection signal electrode disposed on the detection vibration arm.

6. The electronic device according to claim 3, wherein the vibration element is configured to detect angular velocity.

7. The electronic device according to claim 2, wherein the second protective layer contains a metal material.

8. The electronic device according to claim 2, wherein:
the vibration body has a detection vibration arm; and
the electrode has a detection signal electrode disposed on the detection vibration arm.

9. The electronic device according to claim 2, wherein the vibration element is configured to detect angular velocity.

10. An electronic apparatus comprising:
the electronic device according to claim 2; and
a display section.

11. A moving object comprising:
the electronic device according to claim 2; and
an attitude control device to which a detection signal of the electronic device is supplied.

12. The electronic device according to claim 1, wherein: the plurality of layers includes:
    a first insulating layer; and
    a second insulating layer disposed between the first insulating layer and the vibration element;
the wiring line is disposed between the first and second insulating layers; and
the first insulating layer is disposed between the wiring line and the second insulating layer.

13. The electronic device according to claim 12, wherein each of the first insulating layer and the second insulating layer has elasticity.

14. The electronic device according to claim 12, wherein:
the vibration body has a detection vibration arm; and
the electrode has a detection signal electrode disposed on the detection vibration arm.

15. The electronic device according to claim 12, wherein the vibration element is configured to detect angular velocity.

16. The electronic device according to claim 1, wherein the first protective layer contains a metal material.

17. The electronic device according to claim 1, wherein:
the vibration body has a detection vibration arm; and
the electrode has a detection signal electrode disposed on the detection vibration arm.

18. The electronic device according to claim 1, wherein the vibration element is configured to detect angular velocity.

19. An electronic apparatus comprising:
the electronic device according to claim 1; and
a display section.

20. A moving object comprising:
the electronic device according to claim 1; and
an attitude control device to which a detection signal of the electronic device is supplied.

21. The electronic device according to claim 1, wherein the plurality of layers includes:
    a first insulating layer disposed directly on the upper surface of the IC;
    the wiring line disposed directly on the first insulating layer;
    a second insulating layer disposed directly on both the first insulating layer and the wiring line; and
    the connection pad disposed directly on the second insulating layer.

* * * * *